US007544622B2

(12) United States Patent
Bedge

(10) Patent No.: US 7,544,622 B2
(45) Date of Patent: Jun. 9, 2009

(54) PASSIVATION FOR CLEANING A MATERIAL

(75) Inventor: Satish Bedge, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 233 days.

(21) Appl. No.: 10/295,750

(22) Filed: Nov. 15, 2002

(65) Prior Publication Data

US 2003/0094434 A1 May 22, 2003

Related U.S. Application Data

(62) Division of application No. 09/447,299, filed on Jan. 4, 2000, now Pat. No. 6,531,071.

(51) Int. Cl.
*H01L 21/302* (2006.01)

(52) U.S. Cl. .................. 438/705; 438/719; 438/742; 438/753; 216/62; 216/74; 216/87; 134/1.3

(58) Field of Classification Search ................. 438/705, 438/719, 742, 753; 216/62, 74, 87, 99; 134/1.3
See application file for complete search history.

(56) References Cited

U.S. PATENT DOCUMENTS

| 3,837,945 A | 9/1974 | Chiang ................... 156/8 |
| 4,230,523 A | 10/1980 | Gajda | |

(Continued)

FOREIGN PATENT DOCUMENTS

JP   52-21457   6/1977

(Continued)

OTHER PUBLICATIONS

"Fabrication of Novel Three-Dimensional Microstructures by the Anisotropic Etching of (100) and (110) Silicon"; IEEE Transactions of Electron Devices; 1978; vol. ED25; No. 10, pp. 1178-1185; Bassous.*

(Continued)

*Primary Examiner*—George A. Goudreau
(74) *Attorney, Agent, or Firm*—Schwegman, Lundberg & Woessner, P.A.

(57) ABSTRACT

A contact is defined by an opening etched into borophosphosilicate glass (BPSG) down to a silicon substrate. In a contact cleaning process designed to remove native oxide at the bottom of the contact with little effect on the BPSG, the contact is dipped in an etch retardant before being dipped in a cleaning solution containing both the etch retardant and an etchant. The dip in etch retardant modifies the surface of the BPSG, thereby lessening the enhanced etching experienced during the initiation of the dip into the etchant/etch retardant cleaning solution. Results of a etchant/etch retardant clean, both with and without the prepassivation, can be illustrated on a graph depicting the change in contact diameter as a function of dip time. Specifically, the results define "best fit" lines on that graph. For a given dip time, a first line representing the prepassivation+etchant/etch retardant clean is 30 to 40 Angstroms lower than a second line representing the prior art clean using the etchant/etch retardant without prepassivation. Accordingly, the first line's Y-axis intercept, representing the "zero dip time," is also 30 to 40 Angstroms lower than the second line's zero dip time.

37 Claims, 3 Drawing Sheets

U.S. PATENT DOCUMENTS

| | | | | |
|---|---|---|---|---|
| 4,298,402 | A | * | 11/1981 | Hingarh ..................... 438/325 |
| 4,343,677 | A | | 8/1982 | Kinsbron et al. |
| 4,595,519 | A | | 6/1986 | Takeno et al. ............... 252/146 |
| 4,785,337 | A | * | 11/1988 | Kenney ..................... 257/304 |
| 4,871,422 | A | | 10/1989 | Scardera et al. |
| 4,879,457 | A | | 11/1989 | Ludden ..................... 235/487 |
| 4,899,767 | A | | 2/1990 | McConnell et al. ....... 134/56 R |
| 4,921,572 | A | | 5/1990 | Roche |
| 4,992,134 | A | * | 2/1991 | Gupta et al. ............... 438/714 |
| 5,039,349 | A | | 8/1991 | Schoeppel |
| 5,112,437 | A | | 5/1992 | Watanabe et al. |
| 5,277,835 | A | | 1/1994 | Ohmi et al. |
| 5,571,447 | A | | 11/1996 | Ward et al. |
| 5,698,503 | A | | 12/1997 | Ward et al. |
| 5,783,495 | A | | 7/1998 | Li et al. .................... 438/738 |
| 5,855,811 | A | * | 1/1999 | Grieger et al. ............ 252/79.3 |
| 5,990,019 | A | | 11/1999 | Torek et al. |
| 6,012,469 | A | | 1/2000 | Li et al. ..................... 134/1.3 |
| 6,063,712 | A | * | 5/2000 | Gilton et al. ............... 438/756 |
| 6,235,145 | B1 | * | 5/2001 | Li et al. ................. 156/345.29 |
| 6,238,592 | B1 | | 5/2001 | Hardy et al. ............... 252/79.1 |
| 6,280,651 | B1 | | 8/2001 | Wojtczak et al. ........... 252/79.1 |
| 6,358,788 | B1 | | 3/2002 | Chen et al. |
| 6,489,248 | B2 | * | 12/2002 | Zhang et al. ............... 438/714 |
| 6,562,726 | B1 | | 5/2003 | Torek et al. |
| 6,740,595 | B2 | | 5/2004 | Kudelka et al. |
| 6,743,722 | B2 | | 6/2004 | Kassir |
| 2001/0051440 | A1 | | 12/2001 | Torek et al. |
| 2005/0104114 | A1 | | 5/2005 | Chen et al. |
| 2006/0289389 | A1 | | 12/2006 | Shea |
| 2007/0163997 | A1 | | 7/2007 | Shea |
| 2007/0178705 | A1 | | 8/2007 | Shea |

FOREIGN PATENT DOCUMENTS

| | | |
|---|---|---|
| JP | 09-022881 | 1/1997 |

OTHER PUBLICATIONS

Wolf, S., *Silicon Processing for the VLSI Era*, (1), Process Technology,(1986),514-517 and 551-552.

Wolf, S., *Silicon Processing for the VLSI Era*, Lattice press(1), (1986), 514-519.

Blain, M. G., et al., "Chemical downstream etching of tungsten", *J. of Vacuum Science, A*, 16(4), (1998), 2115-2119.

* cited by examiner

PASSIVATION FOR CLEANING A MATERIAL

RELATED APPLICATION

This application is a divisional of U.S. application Ser. No. 09/477,299, filed Jan. 4, 2000, now U.S. Pat. No. 6,531,071.

TECHNICAL FIELD

The present invention relates generally to cleaning methods used in the fabrication of semiconductor devices. More particularly, the present invention pertains to protecting at least one material while removing at least one other material from a workpiece during the fabrication of a semiconductor device.

BACKGROUND OF THE INVENTION

The fabrication of semiconductor devices often involves providing materials over a substrate and shaping those materials through processes such as photolithography and etching. In the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate" also refers to any supporting structure including, but not limited to, the semiconductive substrates described above. Moreover, it is understood that a semiconductor device may comprise conductive and insulative materials as well as a semiconductive material. While etching a semiconductor device, more than one type of material included as part of that device may be exposed to the etching environment, although it may not be desirable to etch all of the exposed materials at the same rate. In fact, some sort of etch selectivity is often preferable.

One example in which etch selectivity is desired involves processing a silicon wafer serving as the substrate, wherein processing is for purposes of constructing a memory device. A doped oxide can be deposited over the silicon substrate using methods known in the art. This doped oxide could be a tetraethylorthosilicate (TEOS) based glass, borophosphosilicate glass (BPSG), borosilicate glass (BSG), phosphosilicate glass (PSG), an arsenic-doped silicon oxide, or some other doped oxide. For purposes of clearly explaining the current invention and its background, it is assumed that BPSG is deposited over the silicon substrate. At least one opening is then formed through the BPSG down to the substrate. This opening may be formed using an etch process as guided by a patterned mask layer over the BPSG. Again, such masking, patterning, and etching processes are known in the art. The resulting patterned BPSG layer allows for a conductive layer to be subsequently deposited, wherein the remaining BPSG portions electrically isolate the conductive material from the substrate, while the opening in the BPSG allows for electrical communication between the conductive material and the substrate. Because this opening allows for electrical contact between different layers, the opening itself is often referred to as a "contact" both in the art and in this specification.

However, before such a conductive layer is deposited, conditions may be present that would interfere with electrical communication between the silicon substrate and the conductive layer to be deposited. For example, once a contact has been etched through the BPSG down to the silicon substrate, the uncovered silicon may be exposed to an oxidizing environment. Such an occurrence may take place in the form of cleaning an organic contaminant from the in-process device. In the presence of sufficient energy, such as thermal energy or that derived from a plasma ambient or an oxidizing liquid ambient, the exposed silicon reacts to form a silicon oxide, such as $SiO_2$. Because the oxide is formed from a chemical reaction with an integral portion of the in-process device, the oxide may be referred to as a "native" or "chemical" oxide that has been "grown" or formed. This is in contrast to a deposited oxide, wherein a deposition process, such as chemical vapor deposition (CVD), provides an oxide layer that is discrete from the in-process device's previously existing structures. The BPSG layer mentioned above is an example of a deposited oxide. In providing an oxide in this manner, a dopant is often added to the ambient during the deposition process and ends up incorporated as part of the oxide. On the other hand, "native" or "chemical" oxides are undoped. Further, such oxides are electrical insulators. Accordingly, if any such oxide is allowed to remain at the bottom of the contact, it will hinder electrical communication between the substrate and a subsequently deposited conductive material.

As a result, in-process devices at this stage of fabrication often undergo cleaning steps to remove the native oxide at the bottom of the contact prior to depositing conductive material. One exemplary cleaning process known in the art concerns the use of solutions including hydrofluoric acid (HF). Either through immersion, spraying, vapor treatment, or other methods, the native oxide of the in-process device is exposed to and etched by the HF solution. The HF cleaning may be performed before, after, or between other cleaning steps performed with other solutions, such as an RCA clean, to provide a hydrogen passivated, hydrophobic, oxide-free surface.

Unfortunately, while HF etches the native oxide from the bottom of the contact, it also etches other oxides, including the deposited BPSG that defines the contact. In fact, a standard HF cleaning solution containing 300 parts $H_2O$ to 1 part HF etches BPSG over native oxide at an etch ratio of 10:1. The result is that the contact's diameter is increased. Widening the contact is detrimental to semiconductor device fabrication, as the contact may be near conductive structures such as the conductive electrode of a capacitor. Because the opening will also be filled with a conductive material, a wider contact means that the two conductive elements will be closer, and the likelihood of a short between the two will therefore be increased, especially in the event of a misalignment in the fabrication process. This is even more of a problem if other processes also widen the contact. In fabricating a dynamic random access memory (DRAM), current process flows call for a contact that is 0.25 microns in diameter and is laterally spaced from a capacitor plate by only about 0.06 to 0.08 microns. Accordingly, any improvements that allow for less of an increase in the contact's diameter are appreciated. In addition, there is a constant need in the industry to fabricate ever-smaller devices in order to maximize the efficient use of the wafer's surface area. This need can be achieved by shrinking the dimension of features, such as the contact diameter. It follows that, once a feature's dimension has been established, it is desired to avoid processes that may increase that dimension. Further, etching the BPSG will also reduce the vertical thickness of the BPSG layer. At current device sizes, reduction in thickness is not as critical a problem as the increase in contact diameter. Nevertheless, thinning the BPSG may be undesirable in certain circumstances. Thus, for these reasons as well as others, those skilled in the art look for ways to eliminate or at least reduce the widening of the contact in the BPSG that occurs while cleaning the bottom of the contact.

The use of other cleaning agents with a more favorable etch selectivity is one way to do so. One cleaning solution known in the industry comprises 30% ammonium fluoride by weight, 1% phosphoric acid, and 69% $H_2O$. This solution has an etch selectivity ratio of 1.5:1, still in favor of BPSG. One vendor identifies this solution as "QE II." Another cleaning solution, comprising 30% ammonium fluoride by weight, 3% phosphoric acid, and 67% $H_2O$, has an etch selectivity ratio of 1:1. This solution is sometimes identified as "Super Q."

Another way to improve etch selectivity is to include an etch retardant in the etching/cleaning solution. Without limiting this or any other invention, it is believed that doing so creates competing reactions, with the etch retardant passivating the BPSG and the etchant etching the BPSG and other oxides, that results in a better etch selectivity in favor of undoped native oxide as opposed to doped deposited oxide. One such solution combines HF; $H_2O$; and a component identified as $(R)_4NOH$, wherein $R=(C_1-C_{20})$alkyl and is preferably tetra ethyl ammonium hydroxide (TEAH) or tetra methyl ammonium hydroxide (TMAH). This chemical is addressed in greater detail in U.S. Pat. No. 5,783,495 by Li et al. and assigned to Micron Technology, Inc. BPSG/native oxide selectivity ratios based on Li's teachings are known to range from 0.5:1 to 2:1. Another selective oxide etchant (identified by one vendor as SOE) achieves a BPSG/native oxide etch selectivity ratio of 0.8:1 using a combination of about 94% glycol by weight, about 5% ammonium fluoride, and about 1% iminodiacetic acid. Iminodiacetic acid is an iminopolycarboxylic acid and, more generally, an iminocarboxylic acid. Iminodiacetic acid may be identified by a molecular formula $C_4H_7NO_4$, while a linear formula for iminodiacetic acid is $HN(CH_2CO_2H)_2$. An exemplary structure for iminodiacetic acid follows.

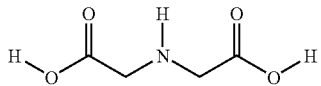

While these methods are useful in fabrication of semiconductor devices as well as other workpieces, there is nevertheless a constant need in the art to further reduce the amount of etching experienced by one type of oxide during a time in which another type of oxide is being etched. More generally, it is desired in the art to reduce the effect of a process on one material while that process acts upon another material.

SUMMARY OF THE INVENTION

Accordingly, the present invention provides for modifying a material in relation to a processing step. In some exemplary embodiments, the surface of a workpiece's doped deposited oxide is passivated before exposing it to an etchant. In more specific embodiments of this type, a silicon wafer having a patterned doped oxide deposited thereon is dipped into an etch retardant prior to dipping the wafer in a solution containing both the etch retardant and an oxide etchant.

Other exemplary embodiments concern a passivation process preceding a cleaning step, wherein the effects of the combined passivation/cleaning steps define a "best fit" line on a chart displaying the change in the dimension of a workpiece's feature as a function of etch time. This line has a lower Y-axis intercept than does a line depicting the effect of the cleaning process without the exemplary passivation process, thereby indicating a preferable reduction in the amount of initial etching of the workpiece.

Still other embodiments encompass other prepassivation methods, post passivation methods, and solutions and systems used therefor.

DETAILED DESCRIPTION OF THE PREFERRED EMBODIMENTS

Figure 1:
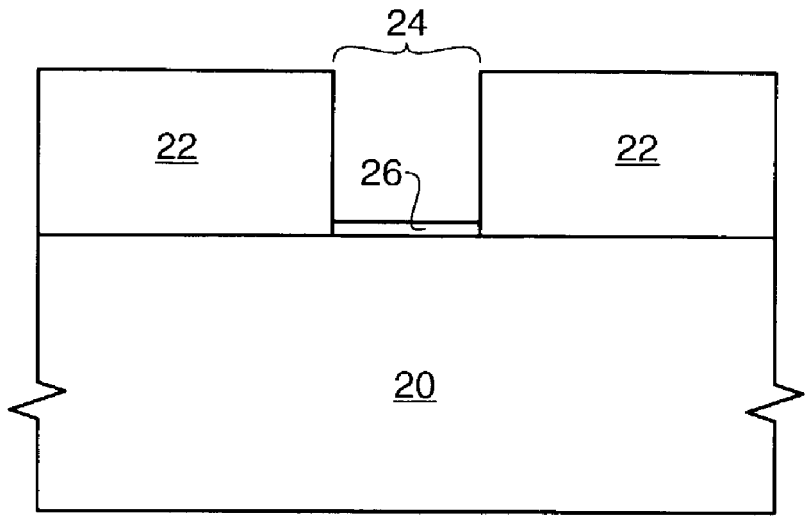
FIG. 1 depicts a cross-sectional view of an in-process semiconductor device known in the art.
Figure 2:
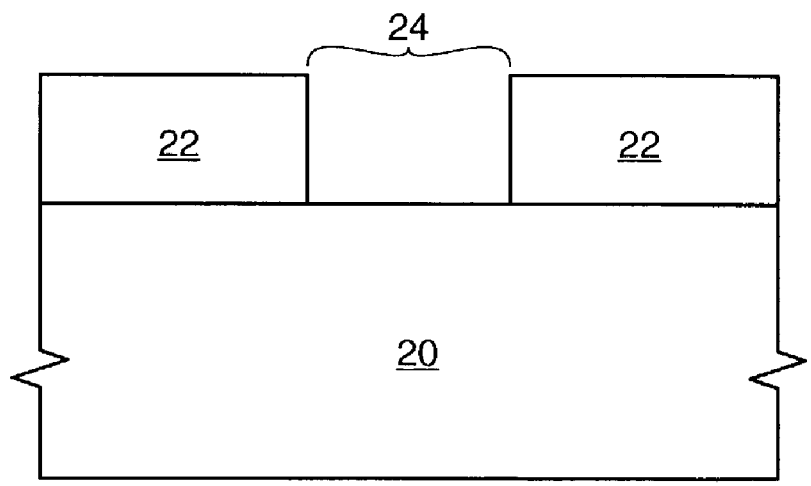
FIG. 2 illustrates a cross-sectional view of an in-process semiconductor device having undergone an exemplary process within the scope of the current invention.

FIG. 1 depicts an in-process portion of a prior art semiconductor device comprising a silicon substrate 20 supporting a BPSG layer 22. A contact 24 has been etched through the BPSG 22, and a native oxide 26 has been formed from the portion of the silicon substrate 20 exposed by contact 24. Regardless of whether this native oxide 26 is intentionally formed or not, or whether the native oxide 26 is desirable at some point or not, it is assumed that by some step in the fabrication process, it is desired to remove the native oxide 26 with little if any effect on the BPSG. This result is pictured in FIG. 2. The effect of prior art attempts to achieve this result can be seen in the graph of FIG. 3. That figure displays the effect of various contact cleaning chemistries (CCS) in terms of the change in contact diameter as a function of the amount of time the silicon substrate remains dipped in a particular chemistry. The change in contact diameter (ΔCD) is measured along the Y-axis in Angstroms, and the dip time is measured along the X-axis in seconds. The diamond-shaped data points "♦" indicate measurements of the change in contact diameter after dipping the wafer in the aforementioned 30% ammonium fluoride/3% phosphoric acid cleaning solution for various lengths of time.

Figure 3:
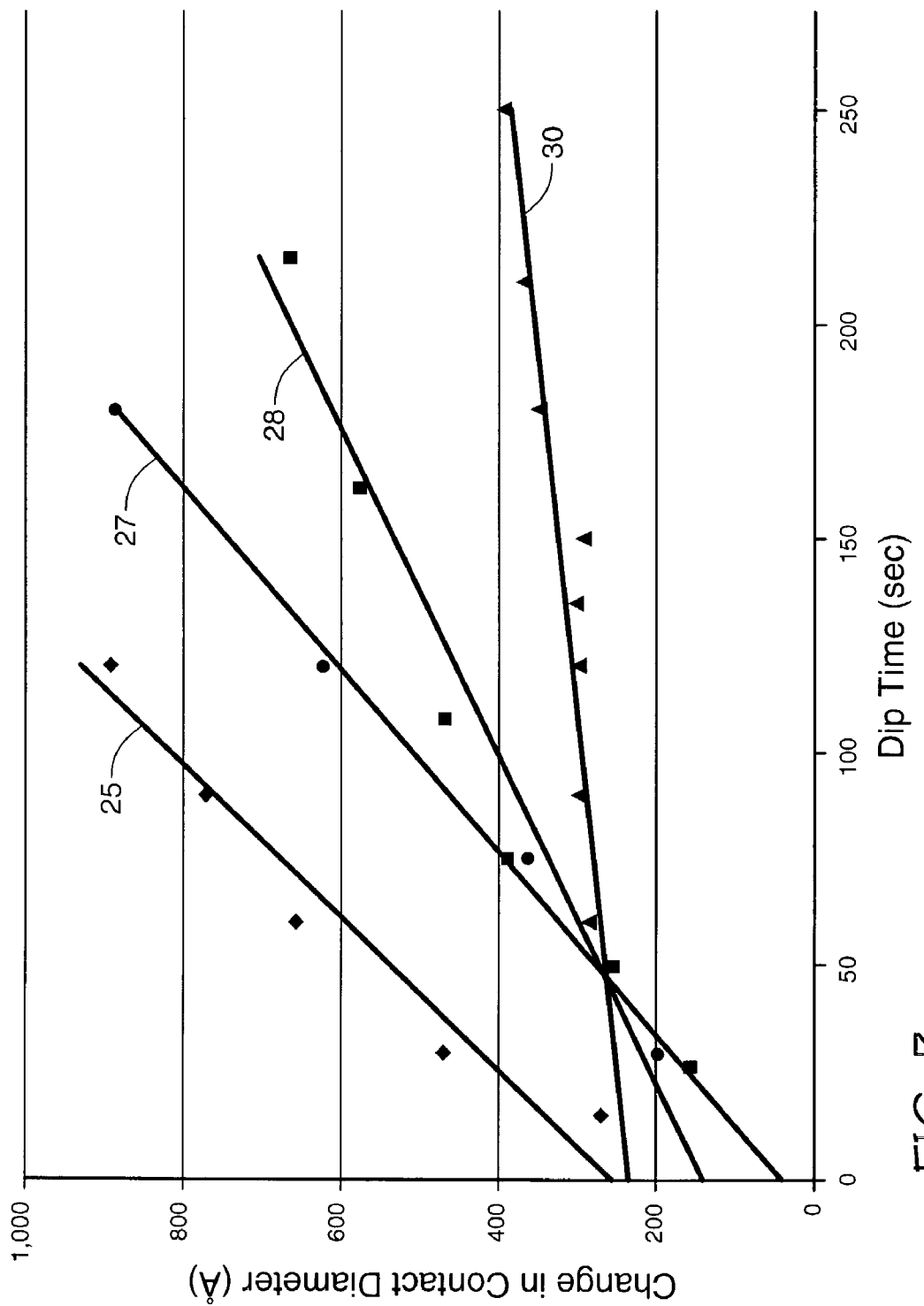
FIG. 3 is a graph illustrating the change in contact diameter as a function of dip time for cleaning solutions known in the art.

It is believed that, were it not for random errors in the experimental measurements, the data could be generally represented by a known mathematical function—specifically, an equation defining a straight line. However, due to these random errors, it is not possible to choose a straight line that agrees with all measurements. As a result, a line 25 has been chosen wherein the average of the squares of the vertical deviations of the diamond-shaped data points from the line 25 is as small as possible. This method of defining line 25 is a type of linear regression known as the "least squares" method, and the resulting line 25 is known as a "best fit" line. Accordingly, the data points were entered into a Microsoft Excel spreadsheet, which derived a graph representing the linear trend of these points using the least squares method. The graph in FIG. 3 is based upon that Excel graph. Similarly, the circular points, square-shaped points, and triangular points in FIG. 3 indicate treatments in dilute HF (300:1 in $H_2O$); 30% ammonium fluoride/1% phosphoric acid; and 94% glycol/5% ammonium fluoride/1% iminodiacetic acid respectively, and define best fit lines 27, 28, and 30 accordingly.

It should be understood, however, that while these lines 25, 27, 28, and 30 serve as general guidelines illustrating the effect of various cleaning agents, the lines 25, 27, 28, and 30 do not necessarily reflect the etching during the entire cleaning process. For instance, it can be seen that none of the of lines 25, 27, 28, and 30 intercept the Y-axis at the point representing 0 angstroms. Rather, lines 25, 27, 28, and 30 intercept that axis at points representing changes in contact diameter (CD) greater than zero angstroms. Thus, a literal interpretation of the graph would suggest that the CD will change (widen) even though the dip time is zero (i.e. with no cleaning). However, without limiting the current invention, the inventor understands that the non-zero intercept instead suggests that the CD changes at a greater rate at the initiation of cleaning, and that this rate eventually decreases to the relatively constant rate indicated by the slopes of lines 25, 27, 28, and 30. The high rate of ΔCD per unit time at the initiation of cleaning, in turn, suggests that the BPSG is initially undergoing some form of enhanced etching that does not occur later in the cleaning process.

Again, without limiting the current invention, it is believed that, in cleaning processes using a solution comprising both an etch retardant and an etchant, it may be that the etchant is reacting with the BPSG faster than the etch retardant is able to begin protecting the BPSG. Once the etch retardant has had time to take effect, the slope of line 30, for instance, becomes lower and changes less. Before that time, however, etching without the benefit of the etch retardant's protective properties may be responsible for the enhanced etching. Moreover, a similar phenomenon may occur at the end of the cleaning process, when the wafer is no longer immersed in the cleaning agent and is subsequently rinsed with deionized water. At that stage of the process, the etch retardant may be leaving the BPSG surface faster than the etchant, leaving the remains of the etchant to act upon the BPSG without the benefit of the etch retardant.

Regardless of the reason for the non-zero Y-intercept of lines 25, 27, 28, and 30 in FIG. 3, at least one exemplary embodiment of the current invention serves to lower the Y-intercept by passivating the BPSG before exposing it to an etchant. A preferred exemplary embodiment concerns treating the in-process semiconductor device comprising the patterned BPSG layer over a silicon substrate that is to be dipped in the glycol/ammonium fluoride/iminodiacetic acid solution. Specifically, before the wafer is exposed to that solution, it is first immersed in a solution that is similar but lacking the ammonium fluoride etchant. More specifically, the wafer is immersed in a glycol matrix containing the iminodiacetic acid surface modifying agent. In this embodiment, the iminodiacetic acid represents up to about 1% of the total weight of the solution. Immersion takes place at a temperature ranging from 15° C. to 35° C. (preferably 25° C.) for a time ranging from 1 to 10 minutes (preferably 5 minutes). Concerning the preferred temperature, it should be noted that 25° C. is also the optimum temperature for the subsequent treatment in glycol/ammonium fluoride/iminodiacetic acid. As for the time, it should be appreciated that the time required to prepassivate the BPSG will vary depending upon the concentrations of the components of the surface modifying solution.

Without limiting the invention, it is believed that the iminodiacetic acid bonds to the boron sites on the BPSG surface, thereby sterically hindering the ability of fluorine to attack the BPSG. More specifically, it is believed that a portion of a given iminodiacetic acid molecule associates with boron in the BPSG, with another portion of the iminodiacetic acid molecule extending over an oxide portion of the BPSG. Thus, when fluorine is introduced, its effect on the BPSG's oxide is hindered by the fact that the iminodiacetic acid is physically interposed between the fluorine and a portion of the BPSG's oxide.

It is further theorized that iminodiacetic acid forms a monolayer—a continuous layer having the thickness of at most single iminodiacetic acid molecule—over the BPSG. It is also possible that the iminodiacetic acid molecules forming the monolayer may have been altered from the $HN(CH_2CO_2H)_2$ formula disclosed above. For example, it is possible that a particular iminodiacetic acid loses a hydrogen atom at some point before or after associating with the BPSG.

Figure 4:
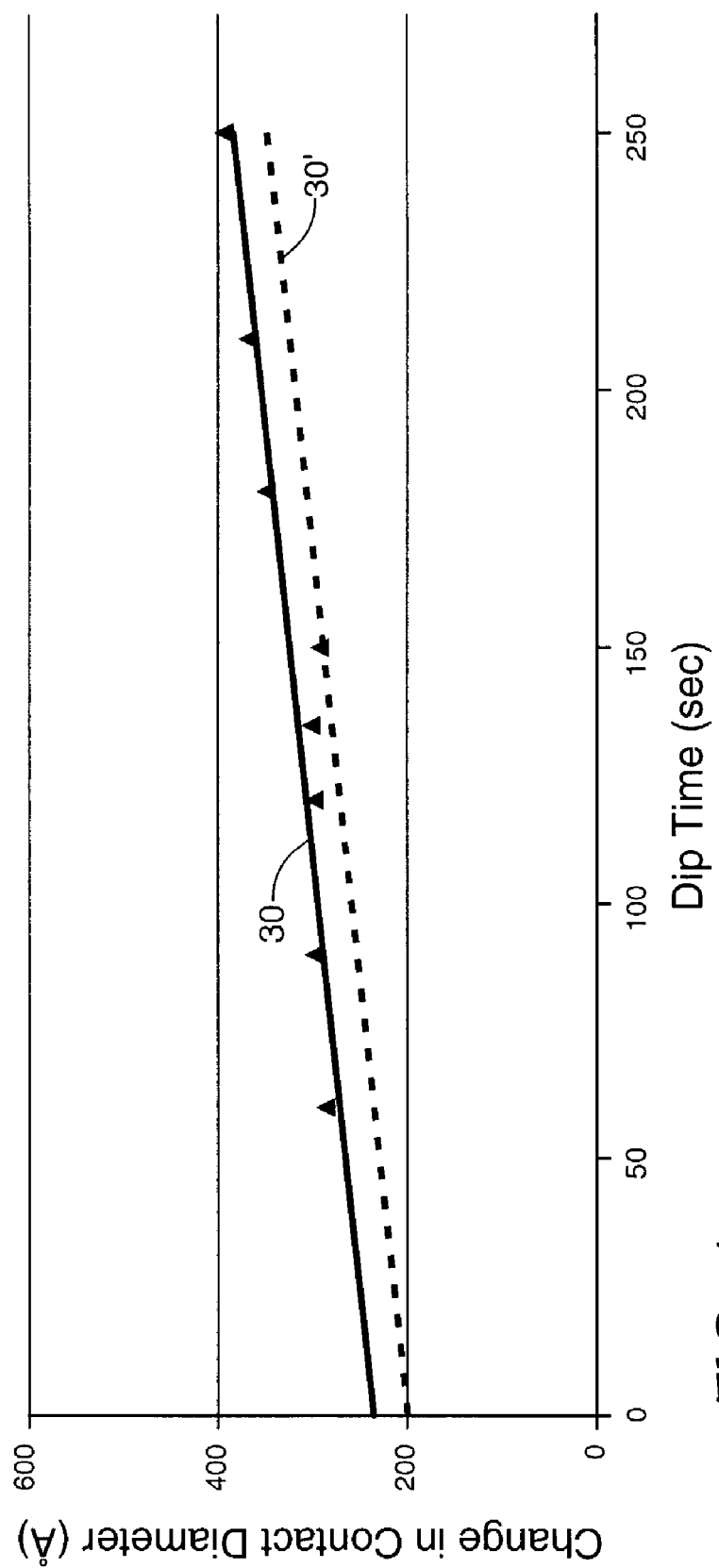
FIG. 4 is another graph illustrating the change in contact diameter as a function of dip time resulting from an exemplary embodiment of the current invention in comparison with a prior art cleaning solution.

Regardless of the exact interaction between BPSG and iminodiacetic acid, the theorized result of cleaning in glycol/ammonium fluoride/iminodiacetic acid after this prepassivation is depicted by line 30' in the chart of FIG. 4. A comparison with line 30 demonstrates that the expected ΔCD for any given time is 30 to 40 Angstroms lower using the prepassivation process of this exemplary embodiment. Accordingly, the Y-intercept of line 30' is 30 to 40 Angstroms lower, indicating a lessening of the enhanced etching suffered during the initiation of the cleaning process. It is preferred, although not required, that this prepassivation step occur immediately before the cleaning step, with no intervening process.

In another exemplary embodiment, the wafer is immersed in an etch reducing component having the formula $(R)_4NOH$, wherein $R=(C_1-C_{20})$alkyl. This is done before exposing the wafer to a solution containing that etch reducing component along with an etchant. In a more specific exemplary embodiment, the wafer is dipped in TMAH before dipping it in a TMAH/HF cleaner. In another specific exemplary embodiment, the wafer is dipped in TEAH before dipping it in a TEAH/HF cleaner. While it is expected that these embodiments will lower the change in contact diameter for a given dip time, it is theorized that at least one reason for this result is that the TMAH or TEAH chemically reacts to neutralize the HF. Such a reaction risks preventing adequate cleaning. Thus, care should be taken to avoid over-protecting the wafer. This can be achieved by methods known in the art such as diluting the TMAH or TEAH bath or by using a vapor or a spray to minimize the volume of TMAH or TEAH available for reaction with the HF.

These exemplary embodiments demonstrate that, if the wafer is to be exposed to a combination etchant/etch retardant, it is preferred to first immerse the wafer in the same etch retardant that is to be used in that combination. This is not a requirement for the invention, however, as other etch retardants could be used for the prepassivation process so long as they do not react with the chemicals of the subsequent cleaning process or another process to the detriment of the completed semiconductor device.

It should also be noted that, in the exemplary embodiment discussed above concerning glycol/ammonium fluoride/iminodiacetic acid, the wafer is prepassivated in a solution comprising all chemicals making up the glycol/ammonium fluoride/iminodiacetic acid with the exception of the etchant; specifically, the wafer is treated in iminodiacetic acid and glycol. Other embodiments, however, allow for treatment in the etch retardant alone, the etch retardant with only some of the chemicals of the cleaner, or the etch retardant with other chemicals that do not appear in the cleaner. Again, it is desired that the chemicals of the prepassivation treatment do not react with those of the cleaning treatment or other process in a manner that will adversely affect the completed semiconductor device.

Moreover, it is not necessary that the wafer be immersed in a surface modifying agent, as exemplary embodiments of the current invention allow for the use of other methods to expose the wafer to a modifying agent. For example, it is possible to spray an etch retardant onto the wafer before cleaning it. Moreover, such spraying may involve centrifugal spraying or high pressure spraying methods as well as others. Additionally, the etch retardant could be applied in a vapor cleaning system.

Additionally, rather than moving the wafer to different chemical environments, exemplary embodiments of the current invention also address maintaining the wafer in a stationary position and altering the chemistry surrounding the wafer. For example, instead of dipping a wafer into a tank of glycol/iminodiacetic acid and then into a tank of glycol/ammonium fluoride/iminodiacetic acid, one could place a wafer in a single tank initially containing a solution of glycol/iminodiacetic acid. Ammonium fluoride could then be added to the solution over time until the desired etch characteristics are achieved. Further, the amount of ammonium fluoride could then be reduced until a solution comprising mostly glycol/iminodiacetic acid exists in the tank once more. Cleaning tanks configured to receive multiple fluids are known in the art, as disclosed by U.S. Pat. No. 4,899,767, assigned to CFM Technologies, Inc. Such tanks could be modified to achieve exemplary embodiments included within the scope of the invention. Other embodiments involving changing the ambient chemistry around the wafer involve the use of spraying devices, vapor cleaning systems, or other delivery devices known in the art.

The exemplary embodiments described above, as well as others, benefit the formation of a device wherein it is sought to remove a native material yet minimize the removal of a deposited material of that device. In addition, such embodiments may be applied wherein it is sought to remove an undoped material of a device yet minimize the removal of a doped material of that device. Exemplary embodiments have still other applications in circumstances concerning the removal of a material formed predominantly by the use of thermal energy while minimizing the removal of a material formed by some alternative process. This alternative process may use thermal energy but may also depend on parameters beyond mere heat and an oxygen source. For example, additional precursor and reactant gases may be required to provide the material.

Further, given the ability of the above described exemplary embodiments to passivate doped deposited oxide in preparation for etching an undoped native oxide, it should be noted that other embodiments of the current invention include passivating doped deposited oxide in preparation for etching a material other than an oxide and in preparation for a process other than etching.

In addition, the native oxide to be etched in the above exemplary embodiments is a side effect of the processes used to fabricate a semiconductor device. The current invention, however, also includes within its scope embodiments wherein a doped oxide portion of a device is protected while etching a native or thermal or grown oxide serving as a particular component of the device.

Still other exemplary embodiments concern allowing selective etching of one portion of a material incorporating a first dopant over a second portion of the material incorporating a second dopant. Moreover, the material need not be an oxide. For example, given a workpiece comprising n+ and p+ polycrystalline silicon regions, passivating the workpiece with iminodiacetic acid solution before exposing the workpiece to an etchant will help protect the p+ regions while the n+ regions are etched. In a preferred exemplary embodiment of this type, the p+ region achieves that state by way of a boron implant or by in situ boron doping during a poly deposition process, in which case the iminodiacetic acid is expected to interact with the boron as described above in other exemplary embodiments.

Furthermore, while many of the exemplary embodiments discussed above address a passivation step and etch/passivation step performed in series, it should be noted that the current invention does not require that the passivation step occur first in the series. Rather, exemplary embodiments also address a passivation step that occurs after the etch/passivation step. Preferably, such a passivation step occurs before rinsing the workpiece in deionized water. As a specific example, after dipping a wafer in a glycol/ammonium fluoride/iminodiacetic acid, the wafer could then be dipped in glycol/iminodiacetic acid. It follows that exemplary embodiments of the current invention also address circumstances wherein a workpiece is passivated both before and after etching. Also, if a passivating agent is included with the etchant, there could be passivation occurring before, during, and after etching. The current invention includes within its scope exemplary embodiments concerning passivation occurring at any of these times, either individually or in combination.

Moreover, one of ordinary skill in the art will appreciate that, although exemplary embodiments of this invention have been described above for purposes of illustration, various modifications may be made without departing from the spirit and scope of the invention. For example, embodiments of the current invention can serve to modify the surface of doped oxides other than BPSG, such as BSG, PSG, arsenic-doped oxides, and others. In addition, a dopant is not necessarily required in the material to be protected, as other exemplary embodiments concern physically or chemically associating the passivating agent with a component of the material. In some exemplary embodiments, this component could be an additive such as nitrogen.

Finally, it should be noted that exemplary embodiments have applications in semiconductor devices such as integrated circuit devices including memory devices, logic devices having embedded memory, application specific integrated circuits, microprocessors, microcontrollers, digital signal processors, and the like incorporating a memory array. It should be emphasized, however, that incorporation with a memory device is not necessary for at least some exemplary embodiments of the current invention. In addition, a memory or a memory module formed in accordance with the present invention may be employed in various types of information handling systems (network cards, telephones, scanners, facsimile machines, routers, televisions, video cassette recorders, copy machines, displays, printers, calculators, and personal computers, and the like incorporating memory). In more general terms, exemplary embodiments of the current invention has application to "tall" structures or devices with topography defining a high aspect ratio. For example, the contact 24 of the in-process device of FIG. 1 defines an opening that is 0.25 microns wide and 2.3 microns deep, thereby defining an aspect ratio of 9.2/1. Thus, while devices exhibiting any aspect ratio (or no aspect ratio at all) will benefit from exemplary embodiments of the invention, devices defining aspect ratios of around 5/1, 6/1 and especially 10/1 or greater receive particular benefit. Accordingly, the invention is not limited except as stated in the claims.

What is claimed is:

1. A method of processing a semiconductor workpiece, comprising:

providing a semiconductor workpiece comprising a material, said material comprising a first region incorporating a first dopant and a second region free of said first dopant, wherein said providing step comprises providing a semiconductor workpiece comprising polycrystalline silicon;

exposing said material to a passivation agent including dipping said material in the passivation agent; and interacting at least a portion of said passivation agent with said first dopant, wherein said interacting step comprises attaching said at least a portion of said passivation agent to said first region by way of said first dopant, wherein said providing step comprises providing a semiconductor workpiece comprising polycrystalline silicon, said polycrystalline silicon comprising a first region incorporating boron;

wherein said providing step comprises providing a semiconductor workpiece comprising polycrystalline silicon, said polycrystalline silicon comprising a second region incorporating a second dopant.

2. The method in claim 1, wherein said providing step comprises providing a semiconductor workpiece comprising polycrystalline silicon, said polycrystalline silicon comprising a second region, wherein said second region is an n+ region.

3. The method in claim 2, further comprising
etching said material; and
interfering with said etching using said at least a portion of said passivation agent.

4. The method in claim 3, wherein said interfering step comprises allowing said at 5. A method of processing a semiconductor workpiece, comprising:
providing a semiconductor workpiece comprising a material, said material comprising a first region incorporating a first dopant and a second region free of said first dopant, wherein said providing step comprises providing a semiconductor workpiece comprising polycrystalline silicon, said polycrystalline silicon comprising a second region incorporating a second dopant, wherein said second region is an n+ region;

exposing said material to a passivation agent;

interacting at least a portion of said passivation agent with said first dopant, wherein said interacting step comprises attaching said at least a portion of said passivation agent to said first region by way of said first dopant;

etching said material, wherein etching said material includes etching using a glycol/ammonium fluoride/iminodiacetic acid solution; and interfering with said etching using said at least a portion of said passivation agent;

wherein said providing step comprises providing a semiconductor workpiece comprising polycrystalline silicon, said polycrystalline silicon comprising a first region incorporating boron.

6. A method of processing a semiconductor workpiece, comprising:
providing a semiconductor workpiece comprising a material, said material comprising a first region incorporating a first dopant and a second region free of said first dopant, wherein said providing step comprises providing a semiconductor workpiece comprising polycrystalline silicon;

exposing said material to a passivation agent, wherein the passivation agent comprises an iminocarboxylic acid; and interacting at least a portion of said passivation agent with said first dopant, wherein said interacting step comprises attaching said at least a portion of said passivation agent to said first region by way of said first dopant, wherein said providing step comprises providing a semiconductor workpiece comprising polycrystalline silicon, said polycrystalline silicon comprising a first region incorporating boron.

7. The method of claim 6, wherein the passivation agent comprises an iminopolycarboxylic acid.

8. A method of processing a semiconductor workpiece, comprising:
providing a semiconductor workpiece comprising a material, said material comprising a first region incorporating a first dopant and a second region free of said first dopant, wherein said providing step comprises providing a semiconductor workpiece comprising polycrystalline silicon;

exposing said material to a passivation agent, wherein the passivation agent comprises $HN(CH_2CO_2H)_2$; and interacting at least a portion of said passivation agent with said first dopant, wherein said interacting step comprises attaching said at least a portion of said passivation agent to said first region by way of said first dopant, wherein said providing step comprises providing a semiconductor workpiece comprising polycrystalline silicon, said polycrystalline silicon comprising a first region incorporating boron.

9. A method of processing a semiconductor workpiece, comprising:
providing a semiconductor workpiece comprising a material, said material comprising a first region incorporating a first dopant and a second region free of said first dopant, wherein said providing step comprises providing a semiconductor workpiece comprising polycrystalline silicon;

exposing said material to a passivation agent, wherein the passivation agent comprises $C_4H_7NO_4$; and interacting at least a portion of said passivation agent with said first dopant, wherein said interacting step comprises attaching said at least a portion of said passivation agent to said first region by way of said first dopant, wherein said providing step comprises providing a semiconductor workpiece comprising polycrystalline silicon, said polycrystalline silicon comprising a first region incorporating boron.

10. A method of processing a semiconductor workpiece, comprising:
providing a semiconductor workpiece comprising a material, said material comprising a first region incorporating a first dopant and a second region free of said first dopant, wherein said providing step comprises providing a semiconductor workpiece comprising polycrystalline silicon;

exposing said material to a passivation agent; and interacting at least a portion of said passivation agent with said first dopant, wherein said interacting step comprises attaching said at least a portion of said passivation agent to said first region by way of said first dopant, and wherein interacting includes etching using a glycol/ammonium fluoride/iminodiacetic acid solution.

11. A method of processing a semiconductor workpiece, comprising:
providing a semiconductor workpiece comprising a material, said material comprising a first region incorporating a first dopant and a second region free of said first dopant, wherein said providing step comprises providing a semiconductor workpiece comprising polycrystalline silicon;

exposing said material to a passivation agent, wherein the passivation agent comprises an iminocarboxylic acid; and interacting at least a portion of said passivation agent with said first dopant, wherein said interacting step comprises attaching said at least a portion of said passivation agent to said first region by way of said first dopant.

12. A method of processing a semiconductor workpiece, comprising:

providing a semiconductor workpiece comprising a material, said material comprising a first region incorporating a first dopant and a second region free of said first dopant, wherein said providing step comprises providing a semiconductor workpiece comprising polycrystalline silicon;

exposing said material to a passivation agent, wherein the passivation agent comprises an iminopolycarboxylic acid; and interacting at least a portion of said passivation agent with said first dopant, wherein said interacting step comprises attaching said at least a portion of said passivation agent to said first region by way of said first dopant.

13. A method of processing a semiconductor workpiece, comprising:

providing a semiconductor workpiece comprising a material, said material comprising a first region incorporating a first dopant and a second region free of said first dopant, wherein said providing step comprises providing a semiconductor workpiece comprising polycrystalline silicon;

exposing said material to a passivation agent, wherein the passivation agent comprises $HN(CH_2CO_2H)_2$; and interacting at least a portion of said passivation agent with said first dopant, wherein said interacting step comprises attaching said at least a portion of said passivation agent to said first region by way of said first dopant.

14. A method of processing a semiconductor workpiece, comprising:

providing a semiconductor workpiece comprising a material, said material comprising a first region incorporating a first dopant and a second region free of said first dopant, wherein said providing step comprises providing a semiconductor workpiece comprising polycrystalline silicon;

exposing said material to a passivation agent, wherein the passivation agent comprises $C_4H_7NO_4$; and interacting at least a portion of said passivation agent with said first dopant, wherein said interacting step comprises attaching said at least a portion of said passivation agent to said first region by way of said first dopant.

15. A method of processing a semiconductor workpiece, comprising:

providing a semiconductor, polycrystalline silicon workpiece comprising a first region of borophosphosilicate glass and a second region free of said borophosphosilicate glass;

exposing said material to a passivation agent; and interacting at least a portion of said passivation agent with said first region, wherein said interacting step comprises attaching said at least a portion of said passivation agent to said first region.

16. A method of processing a semiconductor workpiece, comprising:

providing a semiconductor, polycrystalline silicon workpiece comprising a first region of borophosphosilicate glass and a second region free of said borophosphosilicate glass;

exposing said material to a passivation agent; and interacting at least a portion of said passivation agent with said first region, wherein said interacting step comprises attaching said at least a portion of said passivation agent to said first region;

wherein said providing step comprises providing a second region incorporating a second dopant being free of boron.

17. The method in claim 15, wherein said providing step comprises providing a n+ second region.

18. The method in claim 15, further comprising etching said material with an etch agent; and interfering with said etching using said passivation agent.

19. The method in claim 15, wherein said interfering step comprises allowing said passivation agent to be positioned said first region and said etch agent.

20. The method in claim 18, wherein etching said material includes etching using a glycol/ammonium fluoride/iminodiacetic acid solution.

21. The method in claim 20, wherein interfering includes interfering using a glycol/iminodiacetic acid solution.

22. The method in claim 3, wherein etching said material includes etching using a glycol/ammonium fluoride/iminodiacetic acid solution.

23. The method in claim 5, wherein the passivation agent comprises an iminocarboxylic acid.

24. The method in claim 8, wherein said polycrystalline silicon comprises a second region incorporating a second dopant.

25. The method in claim 9, wherein said polycrystalline silicon comprises a second region, wherein said second region is an n+ region.

26. The method in claim 10, wherein said polycrystalline silicon comprises a second region incorporating a second dopant.

27. The method in claim 11, wherein said polycrystalline silicon comprises a second region incorporating a second dopant.

28. The method in claim 12, wherein said polycrystalline silicon comprises a second region, wherein said second region is an n+ region.

29. The method in claim 13, wherein said polycrystalline silicon comprises a second region incorporating a second dopant, wherein said second region is an n+ region.

30. The method in claim 14, wherein said polycrystalline silicon comprises a second region incorporating a second dopant, wherein said second region is an n+ region.

31. The method of claim 1, wherein the passivation agent includes a glycol solution.

32. The method of claim 1, wherein the passivation agent includes an iminodiacetic acid solution.

33. The method in claim 16, wherein said providing step comprises providing a n+ second region.

34. The method in claim 16, further comprising etching said material with an etch agent; and interfering with said etching using said passivation agent.

35. The method in claim 16, wherein said interfering step comprises allowing said passivation agent to be positioned said first region and said etch agent.

36. The method in claim 34, wherein etching said material includes etching using a glycol/ammonium fluoride/iminodiacetic acid solution.

37. The method in claim 36, wherein interfering includes interfering using a glycol/iminodiacetic acid solution.

* * * * *

UNITED STATES PATENT AND TRADEMARK OFFICE
CERTIFICATE OF CORRECTION

PATENT NO. : 7,544,622 B2  
APPLICATION NO. : 10/295750  
DATED : June 9, 2009  
INVENTOR(S) : Satish Bedge Page 1 of 1

It is certified that error appears in the above-identified patent and that said Letters Patent is hereby corrected as shown below:

In column 9, line 26, in Claim 4, after "at" insert -- least a portion of said passivation agent to extend between said first region and an etch agent. --.

In column 11, line 57, in Claim 15, after "passivation" insert -- agent prior to a step of providing an etching --.

Signed and Sealed this

Twenty-eighth Day of July, 2009

JOHN DOLL  
*Acting Director of the United States Patent and Trademark Office*